United States Patent [19]

Tsukagoshi

[11] Patent Number: 5,051,923
[45] Date of Patent: Sep. 24, 1991

[54] KNOWLEDGE INFERENTIAL PROCESSING APPARATUS

[75] Inventor: Toshihiro Tsukagoshi, Itami, Japan

[73] Assignee: Ricoh Company, Ltd., Tokyo, Japan

[21] Appl. No.: 388,564

[22] Filed: Aug. 1, 1989

[30] Foreign Application Priority Data

Aug. 8, 1988 [JP] Japan ................................ 63-197331

[51] Int. Cl.$^5$ ........................ G06F 15/46; G06F 15/62
[52] U.S. Cl. .................................................. 364/513
[58] Field of Search ........................................ 364/513

[56] References Cited

U.S. PATENT DOCUMENTS

| | | | |
|---|---|---|---|
| 4,700,317 | 10/1987 | Watanabe et al. | 364/513 |
| 4,704,695 | 11/1987 | Kimura et al. | 364/513 |
| 4,740,886 | 4/1988 | Tanifuji et al. | 364/513 |
| 4,748,439 | 5/1938 | Robinson et al. | 364/513 |
| 4,748,570 | 5/1988 | Shochi et al. | 364/513 |
| 4,777,585 | 10/1988 | Kokawa et al. | 364/513 |
| 4,779,208 | 10/1988 | Tsuruta et al. | 364/513 |
| 4,803,642 | 2/1988 | Muranaga | 364/513 |
| 4,849,879 | 7/1989 | Chinnaswamy et al. | 364/513 |
| 4,853,873 | 8/1989 | Tsuji et al. | 364/513 |
| 4,860,214 | 8/1989 | Matsuda et al. | 364/513 |
| 4,868,763 | 9/1989 | Masui et al. | 364/513 |
| 4,903,215 | 2/1990 | Masuishi et al. | 364/513 |
| 4,908,778 | 8/1990 | Moriyasu et al. | 364/513 |

Primary Examiner—Allen R. MacDonald
Assistant Examiner—George Davis
Attorney, Agent, or Firm—Cooper & Dunham

[57] ABSTRACT

A knowledge inferential processing apparatus comprises an external interface section for inputting and outputting information between the knowledge inferential processing apparatus and the exterior thereof; a rule base memory for representing knowledge as a combination of a plurality of rules constructing a premise conditional section and a conclusive section as a pair, and storing the represented knowledge; a rule pointer table for storing a rule pointer group indicative of a sequence for applying the rules within the rule base memory; an inferential processing section for interpreting and executing the rules and judging whether or not the matching is formed with respect to the respective rules; a memory section for storing fact data sent to the inferential processing section and conclusive data generated during the inferential processing; an inferential hysteresis recording section for recording a rule pointer of the matched rule in the matched sequence with respect to the inferential processing results executed by the inferential processing section; and a control section for sequentially sending the rules to the inferential processing section in accordance with the rule pointer group and sending the rule pointer of the matched rule to the inferential hysteresis recording section with respect to the inferential processing results executed by the inferential processing section.

8 Claims, 3 Drawing Sheets

KNOWLEDGE INFERENTIAL PROCESSING APPARATUS

BACKGROUND OF THE INVENTION

The present invention relates to a knowledge inferential processing apparatus. More particularly, the present invention relates to a knowledge inferential processing apparatus for easily confirming processes which provide the inferential results by recording a sequence of the inferential processing results of rules.

Technology relating to knowledge inferential processing apparatus, etc. is disclosed in Japanese Laid-Open Patent Nos. 61-177546 and 62-14227 for example. Such knowledge inferential processing apparatuses have measures for shortening time for processing the inference. However, such knowledge inferential processing apparatuses are not provided with a device for recording and reproducing the processes providing the inferential results. Accordingly, an operator cannot confirm the processes providing the inferential results.

SUMMARY OF THE INVENTION

It is therefore an object of the present invention to provide a knowledge inferential processing apparatus for easily checking the processes providing the inferential results by an operator and reducing contradiction in judgment of rules by providing a device for recording and reproducing the sequence of the inferential processing results of the rules.

The above object of the present invention can be achieved by a knowledge inferential processing apparatus comprising an external interface section for inputting and outputting information between the knowledge inferential processing apparatus and the exterior thereof; a rule base memory for representing knowledge as a combination of a plurality of rules constructing a premise conditional section and a conclusive section as a pair, and storing the represented knowledge; a rule pointer table for storing a rule pointer group indicative of a sequence for applying the rules within the rule base memory; an inferential processing section for interpreting and executing the rules and detecting matching relevant to the respective rules; a memory section for storing fact data sent to the inferential processing section and conclusive data generated during the inferential processing; an inferential hysteresis recording section for recording a rule pointer of the matched rule in the matched sequence with respect to the inferential processing results executed by the inferential processing section; and a control section for sequentially sending the rules to the inferential processing section in accordance with the rule pointer group and sending the rule pointer of the matched rule to the inferential hysteresis recording section with respect to the inferential processing results executed by the inferential processing section.

The inferential processing section performs the matching processing between the supplied rule and the fact data supplied from the memory section. The inferential processing section sends out the rule pointer of the matched rule to the inferential hysteresis recording section. The inferential hysteresis recording section stores the rule pointer in the supplied sequence of the rule pointer.

The control section sends out the rule pointer to the rule base memory in the sequence stored to the rule pointer table or in the arbitrary sequence. The rule base memory sends out the rule indicated by the supplied rule pointer to the external interface section.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a knowledge inferential processing apparatus of the present invention will now be described in detail with reference to the accompanying drawings.

Figure 1:
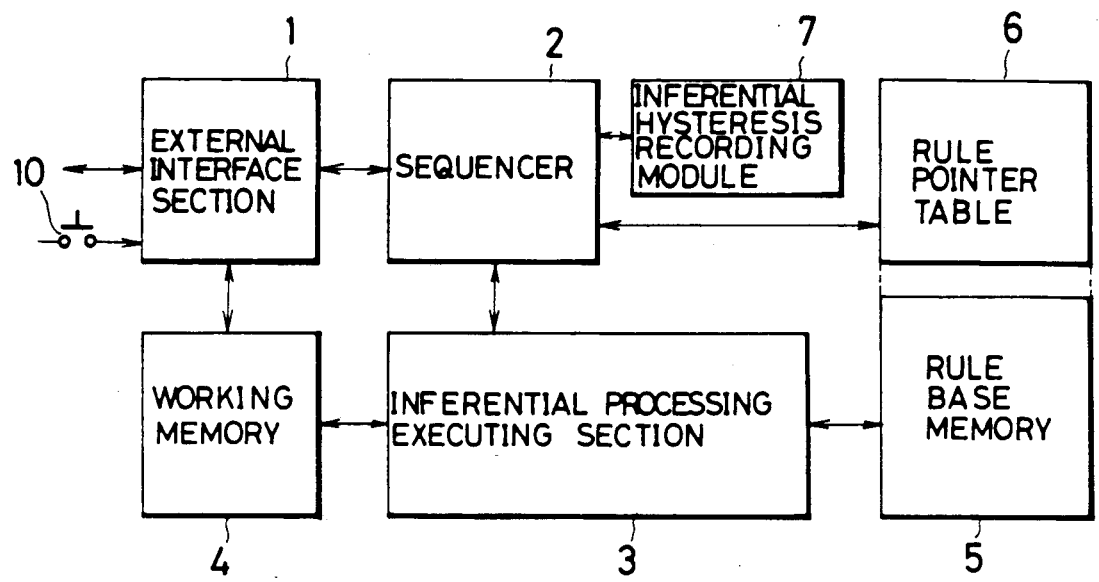
FIG. 1 is a block diagram showing one embodiment of a knowledge inferential processing apparatus of the present invention.

In FIG. 1 showing one embodiment of the knowledge inferential processing apparatus in the present invention, fact data are supplied from the exterior of the apparatus to a working memory 4 through an external interface section 1 to perform a matching operation between the fact data and rules. Thereafter, an inferential start signal for starting the inference is supplied to a sequencer 2 through the external interface section 1. The sequencer 2 sends out sequential information for executing inferential processings to an inferential processing executing section 3. The inferential processing executing section 3 reads out the above fact data stored to the working memory 4. The inferential processing executing section 3 further performs the matching processing between the above fact data and the rules read out of a rule base memory 5 by a rule pointer supplied to the rule base memory 5 from a rule pointer table 6 through the sequencer 2 and the inferential processing executing section 3.

Figure 2:
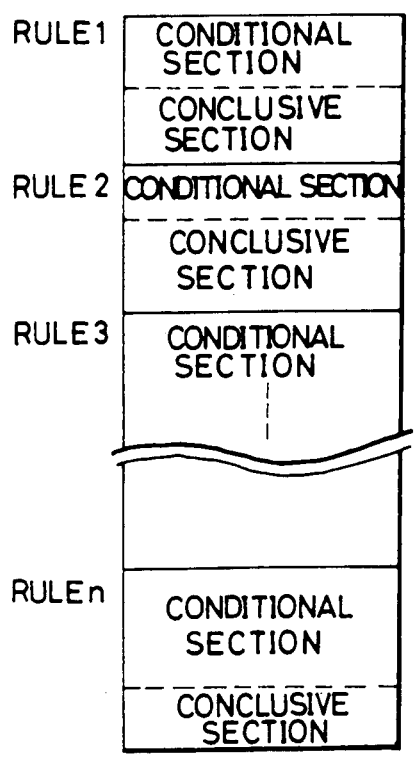
FIGS. 2 and 3 are views showing one detailed example of a rule base memory in the knowledge inferential processing apparatus of the present invention.
Figure 3:
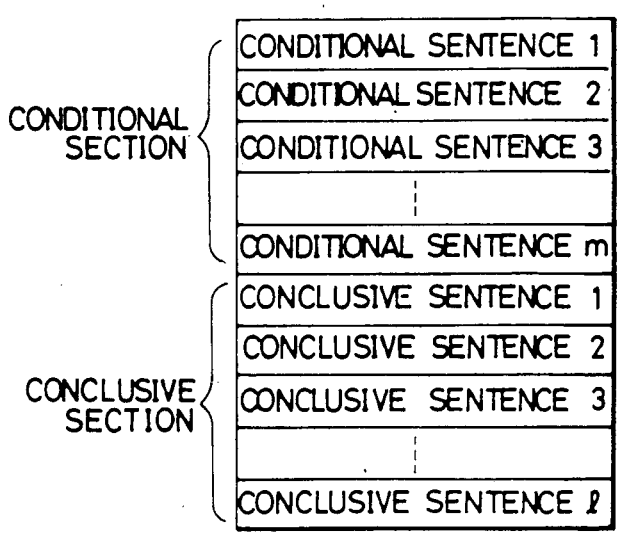
Figure 4:
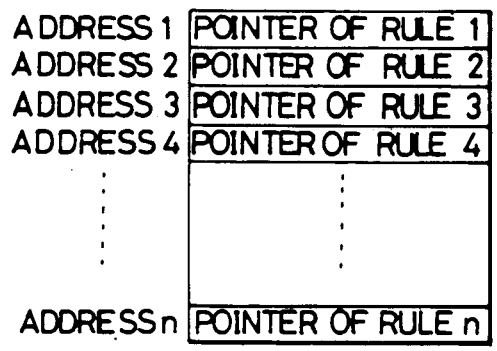
FIG. 4 is a view showing one detailed example of a rule pointer table in the knowledge inferential processing apparatus of the present invention.

As shown in FIG. 2, the rule base memory 5 is composed of n rules from rule 1 to rule n. As shown in FIG. 3, one rule is constructed by a conditional section composed of one or arbitrary m conditional sentences, and a conclusive section composed of one or arbitrary l conclusive sentences. Each conditional sentence and each conclusive sentence are constructed by data of several bits or several bytes. All of the l conclusive sentences are executed only when all of the m conditional sentences are formed. In the respective rules, the conditional and conclusive sentences are arranged by continuous addresses. However, the respective rules within the rule base memory 5 are arranged by continuous or random addresses. Further, the address showing the top of each rule is stored to the rule pointer table 6 as a rule pointer. As shown in FIG. 4, the rule pointer table 6 stores the pointer of rule 1 to address 1 for example and stores the pointer of rule 2 to address 2. The executing sequence of the rules can be set to depend on the sequence of the pointers stored to the rule pointer table 6.

With respect to the matching processing of the above fact and the rules, in the case of the processing in the above conditional section, the inferential processing executing section 3 continuously takes out the rules of the conclusive section and sequentially executes these rules when the matching operation with respect to all of the conditional sentences is formed as mentioned before. At this time, the pointers of the rules matching with all of the conditional sentences are supplied to an inferential hysteresis recording module 7 through the sequencer 2.

Figure 5:
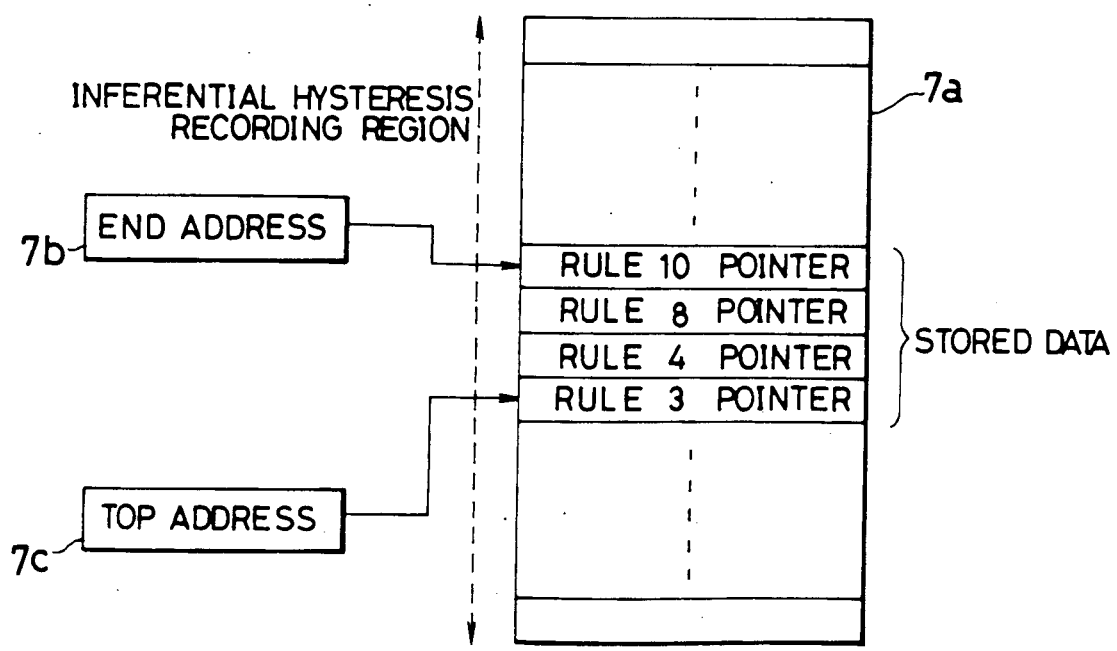
FIG. 5 is a view showing the construction of an inferential hysteresis recording module.

As shown in FIG. 5, the inferential hysteresis recording module 7 is provided with a memory region 7a for storing the pointer of the formed rule, an end address storing register 7b indicative of an end address for storing the pointer, and a top address storing register 7c indicative of a top address storing the pointer. When the pointer of the matched rule supplied from the inferential processing executing section 3 is recorded, the inferential hysteresis recording module 7 refers to the address stored to the end address storing register 7b storing the address of an updated and stored pointer with respect to the pointers already stored. Then, the inferential hysteresis recording module 7 stores the pointer of the above matched rule to the subsequent address, and updates a value of the end address storing register 7b. When the pointer of the rule already stored to the inferential hysteresis recording module 7 is read out, the inferential hysteresis recording module refers to the address stored to the top address storing register 7c storing the address of the first stored pointer with respect to the pointer to be stored, and then reads out the pointer of that address, and updates the value of the top address storing register 7c to a value of the address of a second stored pointer. When the rule pointer is read out, the reading-out operation can be performed by going back from the last stored pointer, which is reverse to the above-mentioned case.

The memory region 7a of the inferential hysteresis recording module 7 is cyclically used, and the values indicated by the registers 7b and 7c are continuously provided from the last address to the first address of the memory region 7a.

As shown in FIG. 1, in the embodiment of the present invention, the inferential hysteresis recording module 7 is independently disposed, but may be also constructed by using a portion of the working memory 4, the rule base memory 5 and the other regions.

The inferential processings proceed as mentioned above. When an operator wants to know processes providing the inferential results or to check these processes, the operator gives suitable commands such as the operation of an operating key 10 to the sequencer 2. Thus, the rule pointers of the inferences stored to the inferential hysteresis recording module 7 in the executed sequence of the inference are sent out to the rule base memory 5 through the sequencer 2 and the inferential processing executing section 3 in the stored sequence of the rule pointers or in an arbitrary sequence thereof. The rule indicated by each supplied rule pointer is sequentially read out by the rule base memory 5. The read rule is sequentially sent from the rule base memory 5 to the exterior of the apparatus through the inferential processing executing section 3, the sequencer 2 and the external interface section 1.

Accordingly, the operator can easily know the processes providing the inferential results so that the burden of checking the above processes is reduced and the occurrence of incorrect inference can be reduced.

When the matching operation is not formed with respect to any one of the conditional sentences, the inferential processing executing section 3 transmits a signal indicative of this state to the sequencer 2 without executing the conclusive sentence. The sequencer 2 extracts the rule pointer of the next rule from the rule pointer table 6 and supplies this rule pointer to the rule base memory 5 through the inferential processing executing section 3. The inferential processing executing section 3 executes the matching operation with respect to the above fact by the rule corresponding to the rule pointer supplied from the rule base memory 5.

The above knowledge inferential processing apparatus is realized by a semiconductor apparatus of one or plural chips for example.

Figure 6:
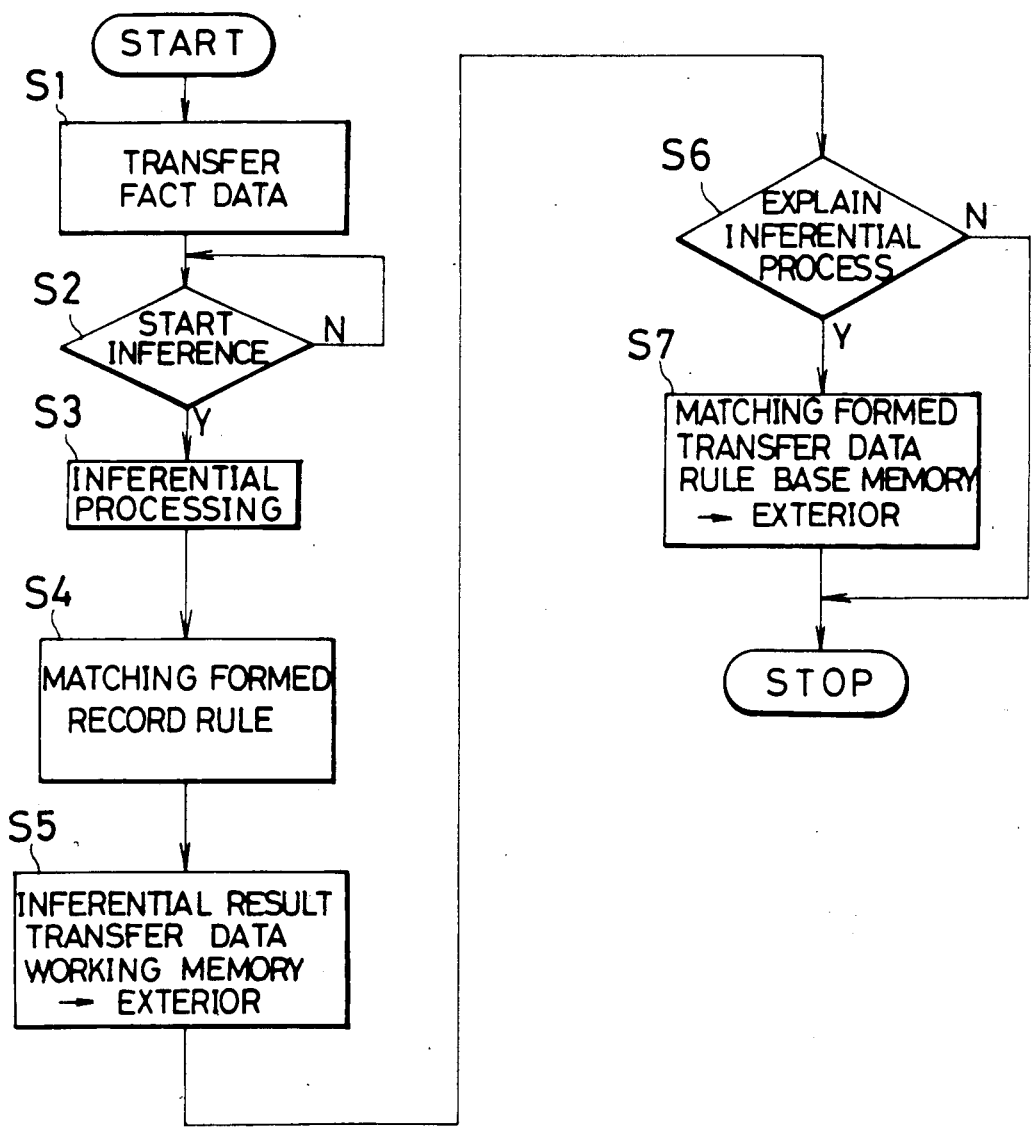
FIG. 6 is a flow chart showing the operation of the knowledge inferential processing apparatus of the present invention.

The operating flow of the knowledge inferential processing apparatus in the present invention will next be described with reference to FIG. 6 showing steps $S_1$ to $S_7$.

In a step $S_1$, the fact data are transferred to the working memory 4 through the external interface section 1. Step $S_2$ determines whether the inferential start signal is inputted or not. When the inference is started, the inferential processing executing section 3 executes the inferential processing between the fact data and the rule outputted from the rule base memory 5 in a step $S_3$. When there is a rule matching with the fact data, the pointer of the matched rule is extracted in a step $S_4$ and the extracted pointer is stored to the inferential hysteresis recording module 7. In a step $S_5$, the inferential results are sent to the exterior of the apparatus from the working memory 4 through the external interface section 1.

In a step $S_6$, when it is not necessary for the operator to record the inferential processes, the above inferential processings are completed. However, when it is necessary for the operator to record the inferential processes, in a step $S_7$, the rule read out of the rule base memory 5 is sent to the exterior of the apparatus from the external interface section 1 by the pointer of the rule stored to the inferential hysteresis recording module 7, thereby completing the inferential processings.

As mentioned above, in accordance with the present invention, the rule pointer of the rule matched in the inferential processing section is stored to the inferential hysteresis recording section in the matched sequence. At a predetermined processing time, the rule is sent out by the operation of a control section to the external interface section from the rule base memory in the sequence of the rule pointer stored into the inferential hysteresis recording section or in an arbitrary sequence thereof. Thus, the operator can easily check the processes providing the inferential results so that contradictions in judgment of the rules can be reduced.

Many widely different embodiments of the present invention may be constructed without departing from the spirit and scope of the present invention. It should be understood that the present invention is not limited to the specific embodiments described in the specification, except as defined in the appended claims. rules;

a memory section for storing fact data sent to said inferential processing section and conclusive data generated during the inferential processing;

an inferential hysteresis recording section for recording a rule pointer of the matched rule in the matched sequence with respect to the inferential processing results executed by the inferential processing section; and a control section for sequentially sending said rules to the inferential processing section in accordance with said rule pointer group and sending the rule pointer of the matched rule to said inferential hysteresis recording section with respect to the inferential processing results executed by the inferential processing section, said control section extracting a rule based on the rule pointer from said rule base memory in the sequence of the rule pointer recorded to said inferential hysteresis recording section or in an arbitrary sequence thereof at a predetermined processing time, said control section further sending out the extracted rule to said external interface section.

What is claimed is:

1. A knowledge inferential processing apparatus comprising:
    an external interface section for interfacing with an exterior having inputting means for inputting fact data;
    a rule base memory for storing a plurality of rules under rule pointers, each rule having a premise condition and a conclusion to be executed if the premise condition is satisfied;
    a rule pointer table for storing a rule pointer group indicative of a sequence for applying the rules within said rule base memory to said fact data;
    a reading out section coupled to said rule base memory for sequentially reading out said rules from said rule base memory in accordance with said rule pointer group;
    an inferential processing section coupled to said reading out section for judging whether or not said fact data match with the premise condition in each of the read out rules and executing the conclusion in each of the read out rules if the fact data match with the premise condition in each of the read out rules;
    a sending out section coupled to said inferential processing section for sending out a rule pointer of a matched rule in which the fact data match with the premise condition therein;
    an inferential hysteresis recording section coupled to said sending out section for recording a rule pointer of the matched rule in a matched sequence to allow a check of a history of an inference.

2. A knowledge inferential processing apparatus as claimed in claim 1, further comprising extracting means for extracting a rule based on the rule pointer from said rule base memory selectively in the sequence of the rule pointer recorded to said inferential hysteresis recording section or in an arbitrary sequence thereof.

3. A knowledge inferential processing apparatus as claimed in claim 2, wherein said external interface section includes outputting means for outputting information to the exterior and said extracting means sends the extracted rule to be outputted to said external interface section.

4. A knowledge inferential processing apparatus as claimed in claim 1, wherein said reading out section includes a sequencer adapted to receive an inferential start signal for starting the inference from said external interface section.

5. A knowledge inferential processing apparatus as claimed in claim 4, wherein said sequencer sends out sequential information for executing the inferential processings to the inferential processing section.

6. A knowledge inferential processing apparatus as claimed in claim 1, wherein said inferential processing section includes interpreting means for interpreting said read out rules.

7. A knowledge inferential processing apparatus as claimed in claim 1, wherein said rule has a plurality of premise conditions and said sending out section is adapted to send out the rule pointer of the rule when the fact data match the whole conditions in said rule.

8. A knowledge inferential processing apparatus as claimed in claim 1, wherein the top address of the stored rule is used as the pointer of said rule.

* * * * *